(12) United States Patent
Tang

(10) Patent No.: US 12,289,977 B2
(45) Date of Patent: Apr. 29, 2025

(54) DISPLAY PANEL, METHOD OF MANUFACTURING DISPLAY PANEL, AND DISPLAY TERMINAL

(71) Applicant: Shenzhen China Star Optoelectronics Semiconductor Display Technology Co., Ltd., Shenzhen (CN)

(72) Inventor: Jia Tang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/610,503

(22) PCT Filed: Sep. 26, 2021

(86) PCT No.: PCT/CN2021/120758
§ 371 (c)(1),
(2) Date: Nov. 11, 2021

(87) PCT Pub. No.: WO2023/039934
PCT Pub. Date: Mar. 23, 2023

(65) Prior Publication Data
US 2024/0251635 A1 Jul. 25, 2024

(30) Foreign Application Priority Data
Sep. 17, 2021 (CN) .......................... 202111090449.8

(51) Int. Cl.
*H10K 59/80* (2023.01)
*H10K 59/12* (2023.01)
*H10K 59/131* (2023.01)

(52) U.S. Cl.
CPC ... *H10K 59/80522* (2023.02); *H10K 59/1201* (2023.02); *H10K 59/131* (2023.02)

(58) Field of Classification Search
None
See application file for complete search history.

(56) References Cited

U.S. PATENT DOCUMENTS

2019/0207168 A1* 7/2019 Lee ..................... H10K 50/824
2021/0193954 A1* 6/2021 Shin ................. H10K 59/80522

FOREIGN PATENT DOCUMENTS

| CN | 1825614 A | 8/2006 |
|---|---|---|
| CN | 109980119 A | 7/2019 |
| CN | 112289945 A | 1/2021 |
| CN | 113097416 A | 7/2021 |

(Continued)

*Primary Examiner* — Michelle Mandala
(74) *Attorney, Agent, or Firm* — Nathan & Associates; Menachem Nathan

(57) ABSTRACT

A display panel, a method of manufacturing a display panel, and a display terminal are provided. Each of the light-emitting device includes a first electrode and a second electrode; the auxiliary wiring comprises a composite metal layer structure, side opening of the auxiliary wiring form an undercut structure, and the second electrode extends into the groove and electrically connects with the auxiliary wire by contacting a portion of metal layers in the undercut. The implementation of the present application can achieve electrical connection between the second electrode of the light-emitting device and the auxiliary wiring without additional manufacturing processes or photomasks.

17 Claims, 7 Drawing Sheets

(56) References Cited

FOREIGN PATENT DOCUMENTS

| | | |
|---|---:|---|
| CN | 113130593 A | 7/2021 |
| CN | 113327937 A | 8/2021 |
| KR | 20160006520 A | 1/2016 |
| KR | 20170015829 A | 2/2017 |

* cited by examiner

DISPLAY PANEL, METHOD OF MANUFACTURING DISPLAY PANEL, AND DISPLAY TERMINAL

FIELD OF INVENTION

The present application relates to a field of display technology, in particular to a display panel, a method of manufacturing a display panel, and a display terminal.

BACKGROUND OF INVENTION

Organic light-emitting display panels (OLED) have been widely used in people lives, such as the display screens of mobile phones and computers. With the development of display technology, large-size organic light-emitting display panels (OLED) will gradually be applied to, such as televisions. However, in a large-size display panel, there is a problem of voltage drop (IR drop). Especially a serious problem of voltage drops of electrodes of light-emitting devices results in uneven voltages at various parts of the display panel to unevenly display.

SUMMARY OF INVENTION

Embodiments of the present application provide a display panel, a method of manufacturing the display panel, and a display terminal, which can solve a problem that serious voltage drops of electrodes of light-emitting devices in a display panel result in uneven voltages at various parts of the display panel to unevenly display.

Embodiments of the present application provides a display panel including an array substrate and light-emitting devices disposed in an array on the array substrate, wherein the array substrate includes an auxiliary wire, and each of the light-emitting devices includes a first electrode and a second electrode disposed on the first electrode; and wherein the auxiliary wire includes a composite metal layer structure, side opening of the auxiliary wire form an undercut structure, the array substrate defines a groove exposing the undercut structure, and the second electrode extends into the groove and electrically connects with the auxiliary wire by contacting a portion of metal layers in the undercut structure.

Optionally, in some embodiments of the present application, the auxiliary wire includes a first sub-metal layer, a second sub-metal layer, and a third sub-metal layer in a stack, and the second sub-metal layer is indented compared to the first sub-metal layer and the third sub-metal layer to form the undercut structure.

Optionally, in some embodiments of the present application, the second electrode contacts the first sub-metal layer of the auxiliary wire.

Optionally, in some embodiments of the present application, the first electrode and the second sub-metal layer are formed by etching with a first etching solution, the first sub-metal layer and the third sub-metal layer are formed by etching with a second etching solution, and the first etching solution is different from the second etching solution.

Optionally, in some embodiments of the present application, a material of the second electrode and the second sub-metal layer includes at least one of aluminum, silver, or molybdenum.

Optionally, in some embodiments of the present application, each of the light-emitting devices includes a light-emitting material layer disposed between the first electrode and the second electrode, and the light-emitting material layer avoids the undercut structure.

Optionally, in some embodiments of the present application, the array substrate includes a thin film transistor, the thin film transistor includes a source drain electrode layer, a gate electrode layer, and a semiconductor layer, and one of the source drain electrode layer or the gate electrode layer is positioned on a same layer with the auxiliary wire.

Optionally, in some embodiments of the present application, the undercut structure is positioned at an edge of the auxiliary wire.

Optionally, in some embodiments of the present application, the auxiliary wire includes a connecting block, a width of the connecting block is greater than a width of any other parts of the auxiliary wire, the connecting block is provided with a through hole, the groove exposes the through hole, and the undercut structure is positioned in the through hole of the connecting block.

Correspondingly, embodiments of the present application provide a method of manufacturing a display panel, including the following manufacturing steps:

step S100: providing a substrate, and forming a thin film transistor and an auxiliary wire of an array substrate on the substrate, wherein one of a source drain electrode layer or a gate electrode layer of the thin film transistor is forming at the same time with the auxiliary wire, and wherein the auxiliary wire includes a composite metal layer structure;

step S200: forming an insulating layer and forming a groove in the insulating layer at the same time, wherein the groove exposes an edge of the auxiliary wire;

step S300: forming a first metal layer on the insulating layer;

step S400: patterning the first metal layer to simultaneously form a first electrode of a light-emitting device and an undercut structure on the auxiliary wire in the groove;

step S500: forming a light-emitting material layer on the first electrode, wherein the light-emitting material layer avoids the undercut structure; and step S600: forming a second electrode of the light-emitting device on the light-emitting material layer, wherein the second electrode is electrically connected to the auxiliary wire by contacting a portion of the composite metal layer structure in the undercut structure.

Optionally, in some embodiments of the present application, in the step S400, the auxiliary wire includes a first sub-metal layer, a second sub-metal layer, and a third sub-metal layer which in a stack, and the second sub-metal layer is indented compared to the first sub-metal layer and the third sub-metal layer to form the undercut structure.

Optionally, in some embodiments of the present application, in the step S400, the first electrode and the second sub-metal layer are forming by etching with a same etching solution, and when etching to form the first electrode and the second sub-metal layer, the first sub-metal layer and the third sub-metal layer are not etched.

Optionally, in some embodiments of the present application, in the step S500, the method of forming the light-emitting material layer includes:

vapor-depositing the light-emitting material layer on the first electrode, wherein a vapor deposition direction of material of the light-emitting material layer is consistent with an opening direction of the undercut structure; or Inkjet printing the light-emitting material layer on the first electrode, wherein the light-emitting material layer does not cover the groove.

Optionally, in some embodiments of the present application, in the step S600, the method of forming the second electrode includes forming the second electrode on the light-emitting material layer, wherein a sputtering direction of material of the second electrode points to the opening direction of the undercut structure.

Correspondingly, embodiments of the present application provide a display terminal, including a terminal main body and a display panel, wherein the terminal main body and the display panel are combined into one body, wherein the display panel includes an array substrate, and light-emitting devices disposed in an array on the array substrate, wherein the array substrate includes an auxiliary wire, and wherein each of the light-emitting devices includes a first electrode and a second electrode disposed on the first electrode; and wherein the auxiliary wire includes a composite metal layer structure, side opening of the auxiliary wire form an undercut structure, the array substrate defines a groove exposing the undercut structure, and the second electrode extends into the groove and electrically connects with the auxiliary wire by contacting a portion of metal layers in the undercut structure.

Optionally, in some embodiments of the present application, the auxiliary wire includes a first sub-metal layer, a second sub-metal layer, and a third sub-metal layer in a stack, and the second sub-metal layer is indented compared to the first sub-metal layer and the third sub-metal layer to form the undercut structure.

Optionally, in some embodiments of the present application, the second electrode contacts the first sub-metal layer of the auxiliary wire.

Optionally, in some embodiments of the present application, the first electrode and the second sub-metal layer are formed by etching with a first etching solution, the first sub-metal layer and the third sub-metal layer are formed by etching with a second etching solution, and the first etching solution is different from the second etching solution.

Optionally, in some embodiments of the present application, each of the light-emitting devices includes a light-emitting material layer disposed between the first electrode and the second electrode, and the light-emitting material layer avoids the undercut structure.

Optionally, in some embodiments of the present application, the array substrate includes a thin film transistor, the thin film transistor includes a source drain electrode layer, a gate electrode layer, and a semiconductor layer, and one of the source drain electrode layer or the gate electrode layer is positioned on a same layer with the auxiliary wire.

In the embodiments of the present application, the structure of the display panel is simple, which can reduce voltage drops of electrodes of the light-emitting devices in the display panel, and can achieve electrical connection between the second electrode of the light-emitting device and the auxiliary wiring without additional manufacturing processes or photomasks, thereby simplifying production processes, improving production efficiency, and saving costs.

DESCRIPTION OF FIGURES

In order to more clearly describe the technical solutions in the embodiments of the present application, the following will briefly introduce the figures needed in the description of the embodiments. Obviously, the figures in the following description are only some embodiments of the present application. For those skilled in the art, without inventive steps, other figures can be obtained based on these figures.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application. In addition, it should be understood that the specific implementations described here are only used to illustrate and explain the present application, and are not used to limit the present application. In the present application, unless otherwise stated, the directional words used such as "upper" and "lower" generally refer to the upper and lower directions of the device in actual use or working state, and specifically refer to the figure directions in the figures. And "inner" and "outer" refer to an outline of the device.

The embodiment of the present application provides a display panel, including an array substrate and light-emitting devices disposed in an array on the array substrate, wherein the array substrate includes an auxiliary wiring, and each of the light-emitting devices includes a first electrode and a second electrode disposed on the first electrode. The array substrate includes at least one groove, the auxiliary wire includes a composite metal layer structure, the auxiliary wire includes at least one undercut structure, the groove exposes the undercut structure. The second electrode extends into the groove and electrically connects with the auxiliary wire by contacting a portion of a composite metal layer in the undercut structure.

The embodiment of the present application provides a display panel, a method of manufacturing the display panel, and a display terminal. Detailed descriptions are provided below. It should be noted that an order of description in the following embodiments is not meant to limit the preferred order of the embodiments.

Embodiment 1

Figure 1:
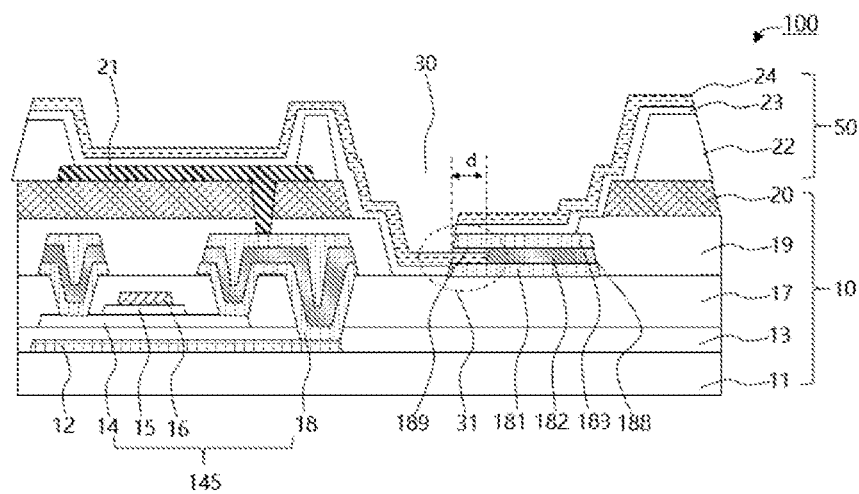
FIG. 1 is a schematic cross-sectional view of a display panel provided by one embodiment of the present application.

Please refer to FIG. 1. FIG. 1 is a schematic cross-sectional view of a display panel 100 according to one embodiment of the present application.

The embodiment of the present application provides a display panel 100. The display panel 100 includes an array substrate 10 and light-emitting devices 50 disposed in an array on the array substrate 10. The array substrate 10 includes an auxiliary wire 188, wherein each of the light-emitting devices 50 includes a first electrode 21, and a second electrode 24 disposed on the first electrode 21. The auxiliary wire 188 includes a composite metal layer structure, side opening of the auxiliary wire 188 form an undercut structure 31. The array substrate 10 includes a groove 30 exposing the undercut structure 31, and the second electrode 24 extends into the groove 30 and electrically connects with the auxiliary wire 188 by contacting a portion of metal layers in the undercut structure 31.

In detail, the array substrate 10 includes at least one groove 30, the auxiliary wire 188 includes the composite metal layer structure, and the auxiliary wire 188 includes at least one undercut structure 31 (shown by a dashed circle in the figure). The groove 30 exposes the undercut structure 31, the second electrode 24 is electrically connected to the auxiliary wire 188 by contacting a portion of metal layers in the undercut structure 31.

In detail, the light-emitting device 50 is disposed on the array substrate 10, and the light-emitting device 50 includes a first electrode 21, a second electrode 24, and a light-emitting material layer 23 sandwiched between the first electrode 21 and the second electrode 24. The second electrode 24 of the light-emitting device 50 is electrically connected to the auxiliary wire 188 on the array substrate 10. A thickness of the second electrode 24 of the light-emitting device 50 is very small, causes an impedance thereof is relatively large, so a voltage drop thereof is very large (IR drop). An impedance of the auxiliary wire 188 is relatively small, and the second electrode 24 is electrically connected to the auxiliary wire 188, which can eliminate the voltage drop of the electrode in the light-emitting device 50 in the display panel 100, avoid voltage unevenness in various parts of the display panel, and prevent a problem of uneven display occurrence.

In detail, the second electrode 24 is electrically connected to the auxiliary wire 188 by contacting a part of the composite metal layer in the undercut structure 31. The second electrode 24 can be electrically connected to the auxiliary wire 188 without manufacturing a separate connection electrode, which can simplify a structure of the display panel 100 and simplify a manufacturing process, and improve production efficiency and save costs.

In some embodiments, the auxiliary wire 188 includes a first sub-metal layer 181, a second sub-metal layer 182, and a third sub-metal layer 183 in a stacked. The second sub-metal layer 182 is indented compared to the first sub-metal layer 181 and the third sub-metal layer 183 to form the undercut structure 31.

In detail, the auxiliary wire 188 includes a multi-layer metal structure, the auxiliary wire 188 may include a three-layer metal structure. The auxiliary wire 188 includes a first sub-metal layer 181, a second sub-metal layer 182, and a third sub-metal layer in a stacked. Compared with the first sub-metal layer 181 and the third sub-metal layer 183, the second sub-metal layer 182 is indented to form the undercut structure 31. That is, in the undercut structure 31, a width of the second sub-metal layer 182 is less than a width of the first sub-metal layer 181 and a width of the third sub-metal layer 183.

In detail, the auxiliary wire 188 has a composite metal layer structure, including a multi-layer metal layer structure, and can form the second sub-metal layer 182 compared with the first sub-metal layer 181 and the third sub-metal layer 183 to form an undercut structure 31. It is convenient for the second electrode 24 to be electrically connected to the auxiliary wire. The second electrode 24 can be electrically connected to the auxiliary wire 188 without manufacturing a separate connection electrode, which simplifies the structure of the display panel 100, simplifies the manufacturing process, and can improve production efficiency and save cost.

In some embodiments, the second electrode 24 contacts the first sub-metal layer 181 connected to the auxiliary wire 188.

In detail, the second electrode 24 is manufactured after the light-emitting material layer 23, and the third sub-metal layer 183 in the undercut structure 31 can shield the light-emitting material layer 23 to prevent the light-emitting material layer 23 from being formed in the undercut structure 31. The second electrode 24 contacts the first sub-metal layer 181 connected to the auxiliary wire 188 so that the second electrode 24 is electrically connected to the auxiliary wire 188 by contacting the first sub-metal layer 181 in the undercut structure 31.

In some embodiments, the first electrode 21 and the second sub-metal layer 182 are formed by etching with a first etching solution. The first sub-metal layer 181 and the third sub-metal layer 183 are formed by etching with a second etching solution. The first etching solution is different from the second etching solution.

In detail, the first electrode 21 and the second sub-metal layer 182 are formed by etching with a same etching solution. When forming the first electrode 21, the second sub-metal layer 182 can be etched with the same etching solution, wherein the first sub-metal layer 181 and the third sub-metal layer 183 are not etched by the etching solution of forming the first electrode 21 at the same time. So that the second sub-metal layer 182 is indented to form the undercut structure 31. In addition, the undercut structure 31 is formed when the first electrode 21 is etched, no additional process or photomask is required, and the manufacturing process of the undercut structure 31 is simple, which simplifies the manufacturing process, improves production efficiency, and saves costs.

In some embodiments, a material of the second electrode 24 and the second sub-metal layer 182 includes at least one of aluminum, silver, and molybdenum.

In detail, the second electrode 24 may be a multilayer metal or alloy of ITO, Ag, molybdenum, etc. A material of the auxiliary wire 188 may be a three-layer metal structure of Ti/Al/Ti. On the basis of using materials of the currently display panel 100, the pattern of the second electrode 24 and the undercut structure 31 can be formed at the same time without adding new materials, thereby simplifying the manufacturing process, improving production efficiency and saving costs.

In detail, the first electrode 21 includes Ag, and the material of the auxiliary wire 188 can include three-layer metal structure of Ti/Al/Ti. Since an Ag etching solution system in the first electrode 21 is the same as an Al etching solution system. The Ag and Al etching solution systems are mainly nitric acid, phosphoric acid, acetic acid, etc. When the first electrode 21 is formed by etching, the Al in the three-layer metal structure of the auxiliary wiring 188 is also etched, wherein the Al is etched laterally to form an opening 189, thereby forming the undercut structure 31.

In some embodiments, each of the light-emitting device 50 includes a light-emitting material layer 23 disposed between the first electrode 21 and the second electrode 24. The light-emitting material layer 23 avoids the undercut structure 31.

In detail, the light-emitting material layer 23 avoids the undercut structure 31, or the light-emitting material layer 23 is not disposed in the undercut structure 31 to facilitate the second electrode 24 to contact the first sub-metal layer 181 connected to the auxiliary wire 188, so that the second electrode 24 is electrically connected to the auxiliary wire 188 by contacting the first sub-metal layer 181 in the undercut structure 31.

In detail, the light-emitting material layer 23 can be formed by an evaporation method. The light-emitting material layer 23 is formed by evaporation on the first electrode 21. An evaporation direction of a material of the light-emitting material layer 23 is consistent with a direction of the opening 189 of the undercut structure 31. At this time, the light-emitting material layer 23 just does not cover the first sub-metal layer 181 in the undercut structure 31.

In detail, the light-emitting material layer 23 can be formed by an inkjet method. The light-emitting material layer 23 is formed by inkjet on the first electrode 21, and the light-emitting material layer 23 does not cover the groove 30.

In some embodiments, the array substrate 10 includes a thin film transistor. The thin film transistor includes a source drain electrode layer 18, a gate electrode layer 16, an active layer 14 (semiconductor layer). One of the source drain electrode layer 18 and the gate electrode layer 16 is position on the same layer as the auxiliary wire 188.

In detail, one of the source drain electrode layer 18 and the gate electrode layer 16 is positioned in the same layer as the auxiliary wire 188. When the source drain electrode layer 18 or the gate electrode layer 16 is formed, the auxiliary wire 188 is formed at the same time. It is not necessary to add additional processes and photomasks, thereby simplifying the manufacturing process, improving production efficiency, and saving costs.

The structure of the display panel 100 in one embodiment will be described in detail below with reference to FIG. 1. The display panel 100 includes a substrate 11, a light shielding layer 12, a buffer layer 13, an active layer 14, a gate insulating layer 15, a gate electrode layer 16, a first insulating layer 17, a source drain electrode layer 18, a second insulating layer 19, a planarization layer 20, a first electrode 21, a pixel defining layer 22, a light-emitting material layer 23, and a second electrode 24. A structure of the display panel 100 is also may include an encapsulation layer covering the second electrode 24, and the layer structure and a layer sequence of the display panel 100 are not limited thereto. For example, the thin film transistor may include a top gate structure or a bottom gate structure, which is not limited.

In detail, the first electrode 21 may be an anode, and the second electrode 24 may be a cathode.

In the embodiment of the present application, the electrical connection between the second electrode 24 and the auxiliary wire 188 can be achieved without additional manufacturing process or photomasks, thereby simplifying the manufacturing process, improving manufacturing efficiency, and saving costs.

Embodiment 2

This embodiment of the present application is the same as or similar to the foregoing embodiment, and the position of the undercut structure 31 is further described in this embodiment.

Figure 2:
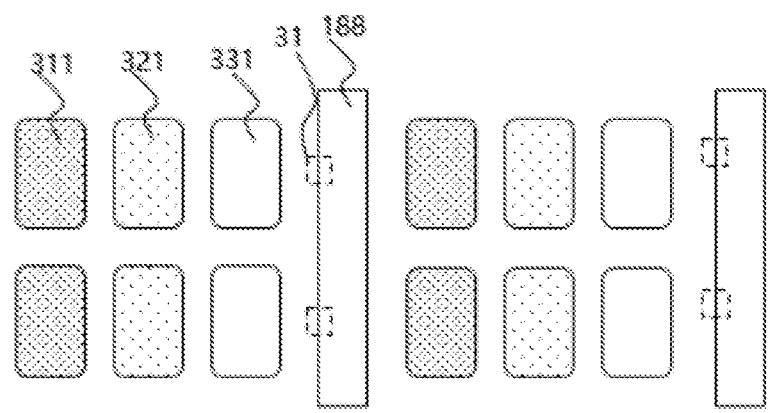
FIG. 2 is a schematic diagram of a first position of the undercut structure on the auxiliary wiring provided by one embodiment of the present application.
Figure 3:
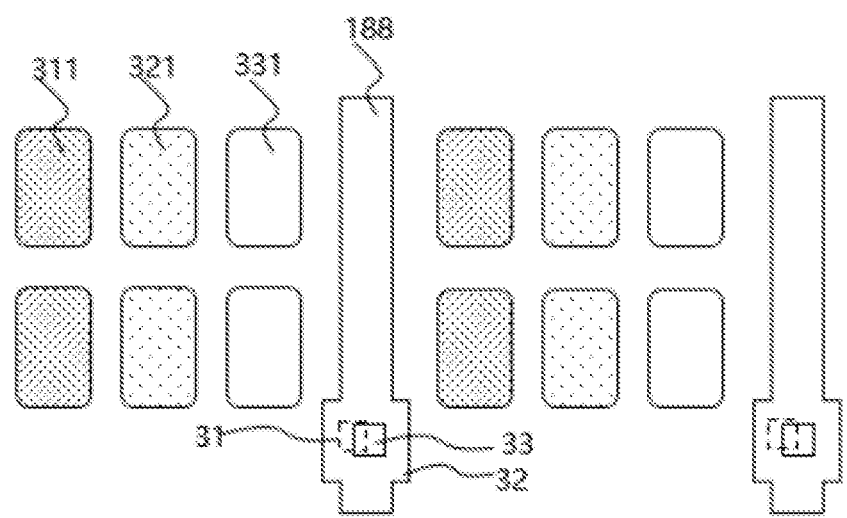
FIG. 3 is a schematic diagram of the second position of the undercut structure on the auxiliary wiring provided by one embodiment of the present application.

Please refer to FIGS. 2 and 3. FIG. 2 is a schematic diagram of a first position of the undercut structure 31 on the auxiliary wire 188 according to one embodiment of the present application. FIG. 3 is a schematic diagram of the second position of the undercut structure 31 on the auxiliary wire 188 according to one embodiment of the present application.

In some embodiments, as shown in FIG. 2, the undercut structure 31 is positioned at an edge of the auxiliary wire 188.

In detail, the display panel 100 includes a plurality of sub-pixels, such as a red sub-pixel 311, a green sub-pixel 321, and a blue sub-pixel 331. The auxiliary wire 188 is disposed between adjacent sub-pixels. The undercut structure 31 is positioned at the edge of the auxiliary wire 188. The second electrode 24 can be well connected to the undercut structure 31 without affecting an aperture ratio or light-emitting area of each sub-pixel.

In detail, the undercut structure 31 is positioned on one edge or two edges of the auxiliary wire 188, which is not limited here.

In detail, a width of the auxiliary trace is W, a width of the opening 189 in the undercut structure 31 is d. That is, a one-side indented width of the second sub-metal layer 182 relative to the first sub-metal layer 181 and the third sub-metal layer 183 is d, then d is less than or equal to $W*\frac{2}{3}$, so that a stability of the undercut structure 31 can be maintained. That is, the undercut structure 31 is stably arranged. A width d of the opening 189 in the undercut structure 31 is greater than 0.5 µm, a sufficient width of the first sub-metal layer 181 in the opening 189 can be provided to facilitate a contact and overlap of the second electrode 24 with the first sub-metal layer 181 in the undercut structure 31.

In detail, in order to ensure a stability of the undercut structure, a thickness of the third sub-metal layer 183 is greater than or equal to 300 angstroms.

In some embodiments, as shown in FIG. 3, the auxiliary wire 188 includes a connecting block 32. A width of the connecting block 32 is greater than a width of any other parts of the auxiliary wire 188. The connecting block 32 is provided with a through hole 33. The groove 30 exposes the through hole. 33, and the undercut structure 31 is positioned in the through hole 33 of the connecting block 32.

In detail, the display panel 100 includes a plurality of sub-pixels, for example, a red sub-pixel 311, a green sub-pixel 321, and a blue sub-pixel 331. The auxiliary wire 188 is arranged between adjacent sub-pixels, and the auxiliary wire 188 includes a connecting block 32. The width of the connecting block 32 is greater than the width of other parts of the auxiliary wire 188, the connecting block 32 includes a through hole 33, the groove 30 exposes the through hole 33, and the undercut structure 31 is positioned in the through hole 33 of the connecting block 32.

In detail, the auxiliary wire 188 is arranged between adjacent sub-pixels, and the second electrode 24 can be well connected to the undercut structure 31 without affecting an aperture ratio or light-emitting region of each sub-pixel. That is, the undercut structure 31 is positioned in the through hole 33 of the connecting block 32 of the auxiliary wire 188. An orientation of the side opening 189 can be any side direction, so that the second electrode 24 can be arranged in any direction with the undercut structure 31. In this way, the second electrode 24 can be electrically connected to the undercut structure 31 in any direction, which improves a convenience of connection between the second electrode and the undercut structure 31.

Embodiment 3

The embodiment of the present application also provides a method of manufacturing the display panel 100 in the above-mentioned embodiment.

Figure 4:
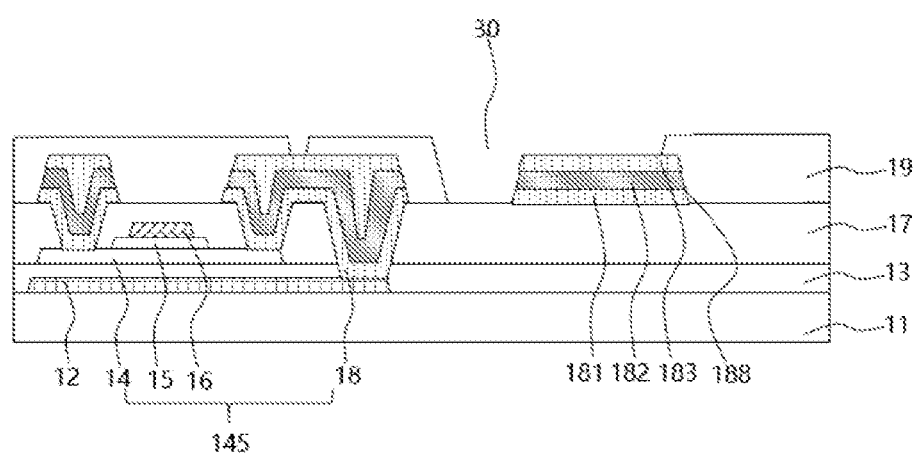
FIG. 4 to FIG. 11 are process schematic diagrams of a method of manufacturing the display panel provided by one embodiment of the present application.
Figure 5:
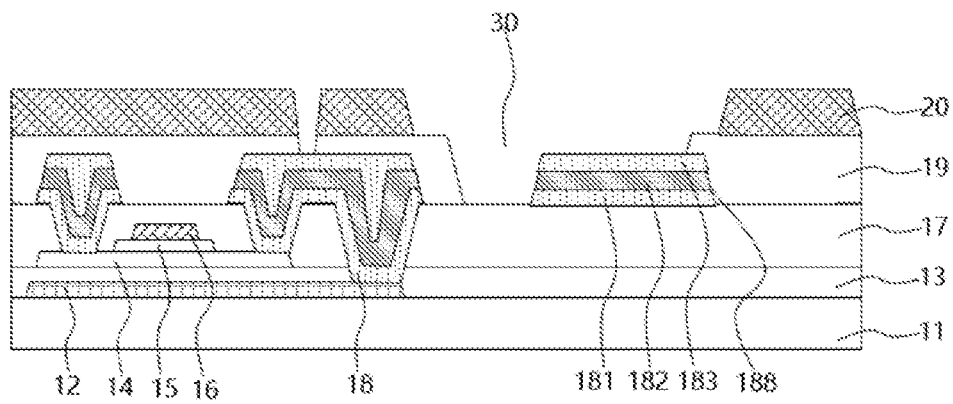
Figure 6:
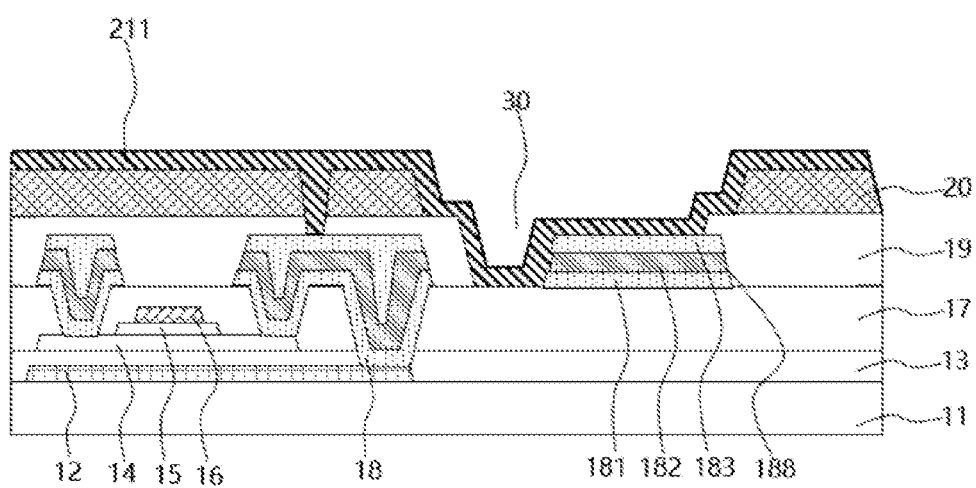
Figure 7:
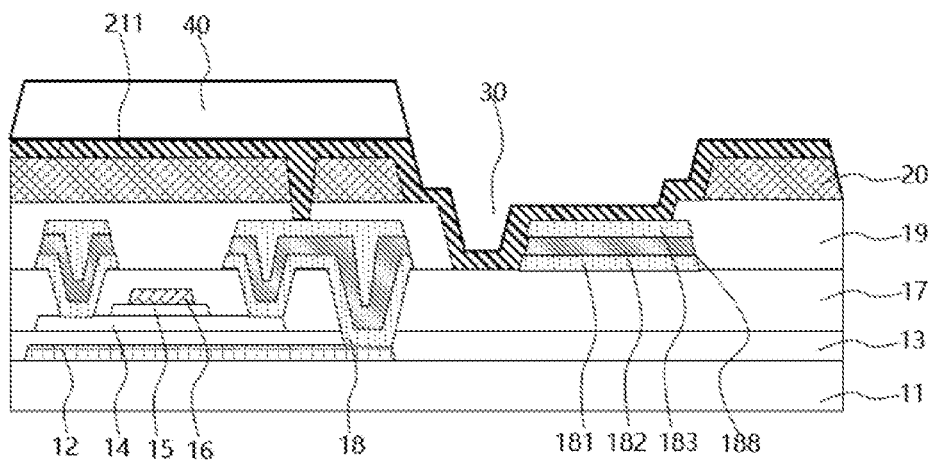
Figure 8:
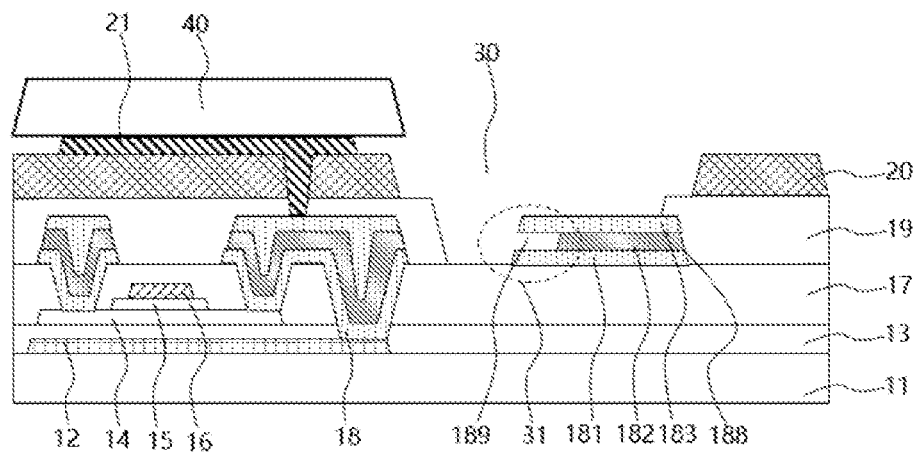
Figure 9:
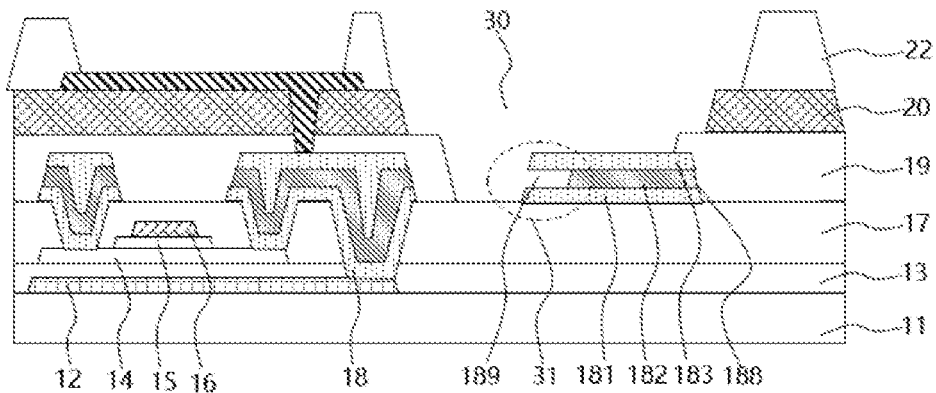
Figure 10:
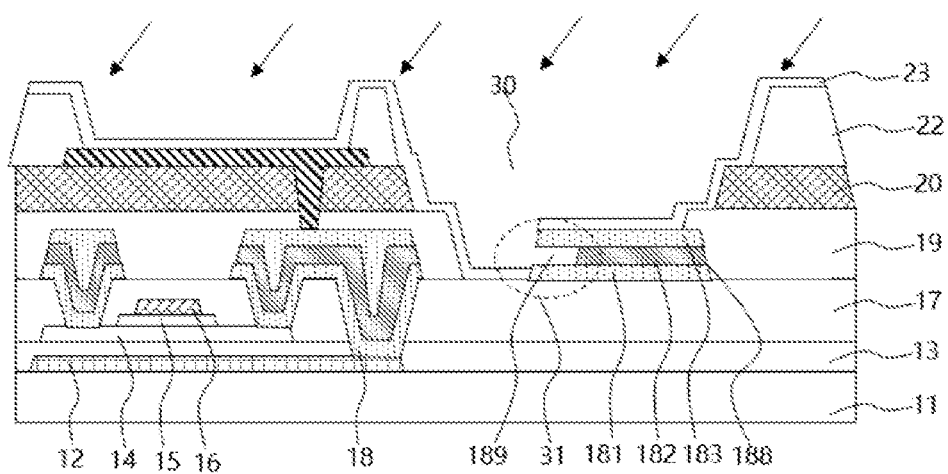
Figure 11:
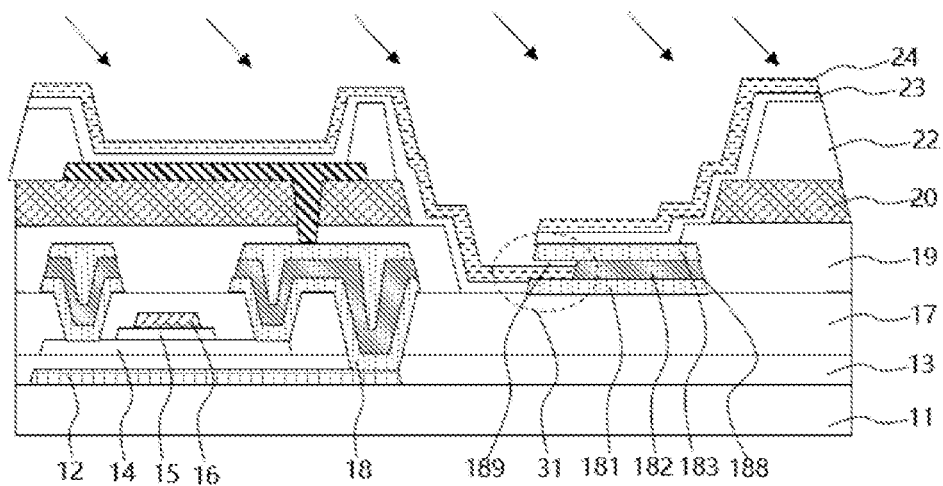

Please refer to FIGS. 4 to 11. FIGS. 4 to 11 are process schematic diagrams of a method of manufacturing the display panel 100. FIG. 4 is a schematic diagram of a manufacturing process of the auxiliary wire 188. FIG. 5 is a schematic diagram of a manufacturing process of the planarization layer 20. FIGS. 6, 7, and 8 are schematic diagrams of a manufacturing process of the first electrode 21 of the light-emitting device 50. FIG. 9 is a schematic view of a manufacturing process of the pixel defining layer 22. FIG. 10 is a schematic view of a manufacturing process of the light-emitting material layer 23. FIG. 11 is a schematic diagram of a manufacturing process of the second electrode 24 of the light-emitting device 50.

Figure 12:
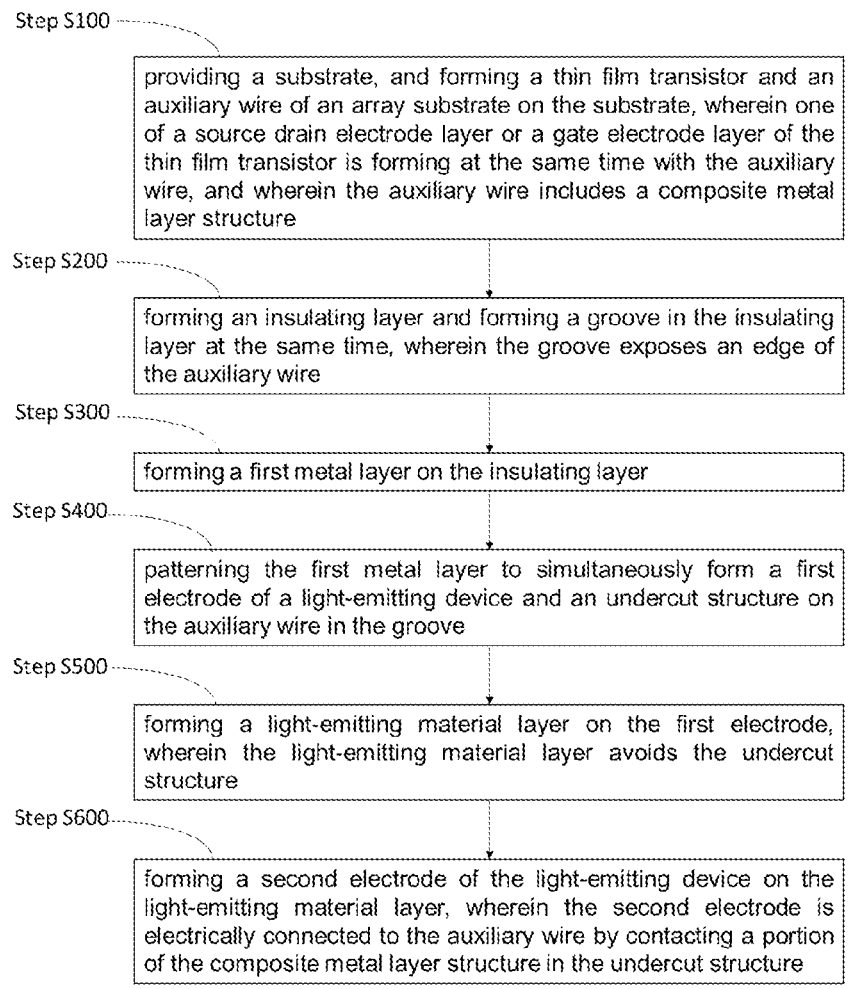
FIG. 12 is a schematic diagram of manufacturing steps of the method of manufacturing the display panel provided by one embodiment of the present application.

Please refer to 12. FIG. 12 is a schematic diagram of the manufacturing steps of the method of manufacturing the display panel 100 according to one embodiment of the application.

The manufacturing method of the display panel 100 provided in the present embodiment includes manufacturing steps: step S100, step S200, step S300, step S400, step S500, and step S600.

Step S100: Providing a substrate 11, and forming a thin film transistor 145 and an auxiliary wire 188 of the array substrate on the substrate 11, wherein one of a source drain electrode layer 18 or a gate electrode layer 16 of the thin film transistor is forming at the same time with the auxiliary wire 188, and wherein the auxiliary wire 188 includes a composite metal layer structure.

In detail, as shown in FIG. 4, the thin film transistor 145 is formed on the substrate 11. The thin film transistor 145 includes an active layer 14, a gate insulating layer 15, a gate electrode layer 16, a source drain electrode layer 18, and the gate electrode layer 16. The auxiliary wire 188 is formed simultaneously with one of the source drain electrode layer 18 and the gate electrode layer 16. One of the gate electrode layer 16 and the source drain electrode layer 18 is patterned and formed at the same time as the auxiliary wiring 188. FIG. 4 shows that the auxiliary wire 188 is arranged in the same layer as the source drain electrode layer 18 and formed by the same process.

Step S200: Forming an insulating layer, and forming a groove 30 in the insulating layer at the same time, wherein the groove 30 exposes an edge of the auxiliary wire 188.

In detail, as shown in FIGS. 4 and 5, an insulating layer is formed on the thin film transistor 145, and the insulating layer includes a groove 30 that exposes the edge of the auxiliary wire 188 in preparation of the subsequent formation of the undercut structure 31.

Step S300: Forming a first metal layer 211 on the insulating layer, as shown in FIG. 6.

In detail, the first metal layer 211 is patterned to form the first electrode 21 of the light-emitting device 50 in a subsequent step.

Step S400: Patterning the first metal layer 211 to simultaneously form a first electrode 21 of a light-emitting device 50 and an undercut structure 31 on the auxiliary wire 188 in the groove 30.

In detail, as shown in FIGS. 7 and 8, the etching solution for patterning the first metal layer 211 can simultaneously etch part of the composite metal layer in the auxiliary wire 188, specifically an intermediate layer.

In detail, a patterned photoresist layer 40 is formed on the first metal layer 211, and the shape of the patterned photoresist layer 40 corresponds to or is approximately the same as the shape of the first electrode 21 to be formed (the patterned photoresist layer 40 The pattern covers the part of the first electrode 21 that needs to be formed).

In detail, the first electrode 21 and the second sub-metal layer 182 are formed by etching with a same etching solution. When forming the first electrode 21, the second sub-metal layer 182 can be etched with the same etching solution, wherein the first sub-metal layer 181 and the third sub-metal layer 183 are not etched by the etching solution of forming the first electrode 21 at the same time. So that the second sub-metal layer 182 is indented to form the undercut structure 31. In addition, the undercut structure 31 is formed when the first electrode 21 is etched, no additional process or photomask is required, and the manufacturing process of the undercut structure 31 is simple, which simplifies the manufacturing process, improves production efficiency, and saves costs.

In detail, the second electrode 24 may be a multilayer metal or alloy of ITO, Ag, molybdenum, etc. A material of the auxiliary wire 188 may be a three-layer metal structure of Ti/Al/Ti. On the basis of using materials of the currently display panel 100, the pattern of the second electrode 24 and the undercut structure 31 can be formed at the same time without adding new materials, thereby simplifying the manufacturing process, improving production efficiency and saving costs.

In detail, the first electrode 21 includes Ag, and the material of the auxiliary wire 188 can include three-layer metal structure of Ti/Al/Ti. Since an Ag etching solution system in the first electrode 21 is the same as an Al etching solution system. The Ag and Al etching solution systems are mainly nitric acid, phosphoric acid, acetic acid, etc. When the first electrode 21 is formed by etching, the Al in the three-layer metal structure of the auxiliary wiring 188 is also etched, wherein the Al is etched laterally to form an opening 189, thereby forming the undercut structure 31.

Step S500: Forming a light-emitting material layer 23 on the first electrode, wherein the light-emitting material layer 23 avoids the undercut structure 31, as shown in FIG. 10.

In detail, the light-emitting material layer 23 avoids the undercut structure 31, or the light-emitting material layer 23 is not disposed in the undercut structure 31 to facilitate the second electrode 24 to contact the first sub-metal layer 181 connected to the auxiliary wire 188, so that the second electrode 24 is electrically connected to the auxiliary wire 188 by contacting the first sub-metal layer 181 in the undercut structure 31.

In detail, before forming the light-emitting material layer 23, it further includes forming a pixel definition layer 22, as shown in FIG. 9.

Step S600: forming a second electrode 24 of the light-emitting device 50 on the light-emitting material layer 23, wherein the second electrode 24 is electrically connected to the auxiliary wire 188 by contacting a portion of the composite metal layer in the undercut structure 31, as shown in FIG. 11.

In some embodiments, in step S400, the auxiliary wire 188 includes a first sub-metal layer 181, a second sub-metal layer 182, and a third sub-metal layer 183 in a stacked. The second sub-metal layer 182 is indented compared to the first sub-metal layer 181 and the third sub-metal layer 183 to form the undercut structure 31.

In detail, the auxiliary wire 188 includes a multi-layer metal structure, the auxiliary wire 188 may include a three-layer metal structure. The auxiliary wire 188 includes a first sub-metal layer 181, a second sub-metal layer 182, and a third sub-metal layer in a stacked. Compared with the first sub-metal layer 181 and the third sub-metal layer 183, the second sub-metal layer 182 is indented to form the undercut structure 31. That is, in the undercut structure 31, a width of the second sub-metal layer 182 is less than a width of the first sub-metal layer 181 and a width of the third sub-metal layer 183.

In some embodiments, in step S400, the first electrode 21 and the second sub-metal layer 182 are formed by etching with a same etching solution, and when the first electrode 21 and the second sub-metal layer 182 are etched, the first sub-metal layer 181 and the third sub-metal layer 183 are not etched.

In detail, the first electrode 21 and the second sub-metal layer 182 are formed by etching with the same etching solution. When forming the first electrode 21, the second sub-metal layer 182 can be etched with the same etching solution, wherein the first sub-metal layer 181 and the third sub-metal layer 183 are not etched by the etching solution of forming the first electrode 21 at the same time. So that the second sub-metal layer 182 is indented to form the undercut structure 31. In addition, the undercut structure 31 is formed when the first electrode 21 is etched, no additional process or photomask is required, and the manufacturing process of the undercut structure 31 is simple, which simplifies the manufacturing process, improves production efficiency, and saves costs.

In detail, the second electrode 24 may be a multilayer metal or alloy of ITO, Ag, molybdenum, etc. A material of the auxiliary wire 188 may be a three-layer metal structure of Ti/Al/Ti. On the basis of using materials of the currently display panel 100, the pattern of the second electrode 24 and the undercut structure 31 can be formed at the same time without adding new materials, thereby simplifying the manufacturing process, improving production efficiency and saving costs.

In some embodiments, in step S500, the method of forming the light-emitting material layer 23 includes: vapor-depositing the light-emitting material layer 23 on the first electrode 21, wherein a vapor deposition direction of material of the light-emitting material layer 23 is consistent with an opening 189 direction of the undercut structure 31; or Inkjet printing the light-emitting material layer 23 on the first electrode 21, wherein the light-emitting material layer 23 does not cover the groove 30.

In detail, the light-emitting material layer 23 can be formed by an evaporation method. The light-emitting material layer 23 is formed by evaporation on the first electrode 21. An evaporation direction of a material of the light-emitting material layer 23 is consistent with a direction of the opening 189 of the undercut structure 31. At this time, the light-emitting material layer 23 just does not cover the first sub-metal layer 181 in the undercut structure 31.

In detail, the light-emitting material layer 23 can be formed by an inkjet method. The light-emitting material layer 23 is formed by inkjet on the first electrode 21, and the light-emitting material layer 23 does not cover the groove 30.

In some embodiments, in step S600, the method of forming the second electrode 24 includes: forming the second electrode 24 on the light-emitting material layer 23, and a sputtering direction of the material of the second electrode 24 points to Inside the opening 189 of the undercut structure 31.

In detail, the sputtering direction of the material of the second electrode 24 points to the direction inside the opening 189 of the undercut structure 31, so that the second electrode 24 can be directly formed inside the undercut structure 31 at the same time, and is contacted with the first sub-metal layer 181, thereby electrically connecting the second electrode 24 with the auxiliary wire 188.

In the method of manufacturing the display panel provided by the embodiment of the present application, one of the source drain electrode layer 18 and the gate electrode layer 16 is positioned in the same layer as the auxiliary wire 188. When the source drain electrode layer 18 or the gate electrode layer 16 is formed, the auxiliary wire 188 is formed at the same time. It is not necessary to add additional processes and photomasks, thereby simplifying the manufacturing process, improving production efficiency, and saving costs.

In the method of manufacturing the display panel provided by the embodiment of the present application, the first electrode 21 and the second sub-metal layer 182 are formed by etching with a first etching solution. When forming the first electrode 21, the second sub-metal layer 182 can be etched with the same etching solution, wherein the first sub-metal layer 181 and the third sub-metal layer 183 are not etched by the etching solution of forming the first electrode 21 at the same time. So that the second sub-metal layer 182 is indented to form the undercut structure 31. In addition, the undercut structure 31 is formed when the first electrode 21 is etched, no additional process or photomask is required, and the manufacturing process of the undercut structure 31 is simple, which simplifies the manufacturing process, improves production efficiency, and saves costs.

In the manufacturing method of the display panel provided by the embodiment of the present application, the light-emitting material layer 23 avoids the undercut structure 31, or the light-emitting material layer 23 is not disposed in the undercut structure 31 to facilitate the second electrode 24 to contact the first sub-metal layer 181 connected to the auxiliary wire 188, so that the second electrode 24 is electrically connected to the auxiliary wire 188 by contacting the first sub-metal layer 181 in the undercut structure 31.

In the manufacturing method of the display panel provided by the embodiment of the present application, the second electrode 24 is electrically connected to the auxiliary wire 188 by contacting a part of the composite metal layer in the undercut structure 31. The second electrode 24 can be electrically connected to the auxiliary wire 188 without manufacturing a separate connection electrode, which can simplify a structure of the display panel 100 and simplify a manufacturing process, and improve production efficiency and save costs. The auxiliary wire 188 has a composite metal layer structure, including a multi-layer metal layer structure, and can form the second sub-metal layer 182 compared with the first sub-metal layer 181 and the third sub-metal layer 183 to form an undercut structure 31. It is convenient for the second electrode 24 to be electrically connected to the auxiliary wire. The second electrode 24 can be electrically connected to the auxiliary wire 188 without manufacturing a separate connection electrode, which simplifies the structure of the display panel 100, simplifies the manufacturing process, and can improve production efficiency and save cost.

In the method of manufacturing the display panel provided by the embodiment of the present application, the second electrode 24 of the light-emitting device 50 and the auxiliary wire 188 can be electrically connected without additional manufacturing process or mask, which simplifies the manufacturing process, and can improve production efficiency and save costs.

Embodiment 4

One embodiment of the present application also provides a display terminal 1000, which includes a terminal body 1001 and the display panel 100 of any one of the foregoing embodiments, and the terminal body 1001 and the display panel 100 are combined into one body.

Figure 13:
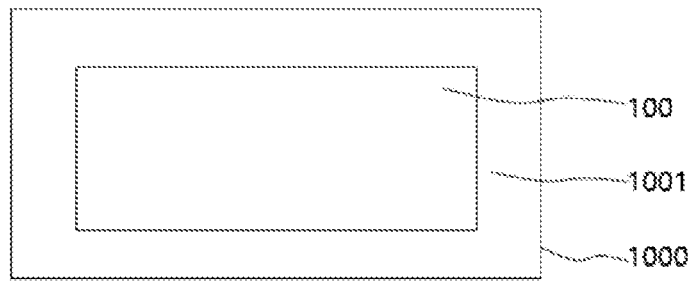
FIG. 13 is a schematic diagram of a display terminal provided by one embodiment of the present application.

Please refer to FIG. 13, which is a schematic diagram of the display terminal 1000 according to one embodiment of the present application.

The above provides a detailed introduction to a display panel, a method of manufacturing a display panel, and a display terminal provided by the embodiments of the present application. Specific examples are used in this article to illustrate the principles and implementations of the present application. The description of the above embodiments is only used to help understand the method and its core idea of the present application. At the same time, for those skilled in the art, according to the idea of the present application, there will be changes in the specific implementation and the scope of application. In summary, content of the specification should not be construed as a limitation on the present application.

What is claimed is:

1. A display panel comprising an array substrate and light-emitting devices disposed in an array on the array substrate, wherein the array substrate comprises an auxiliary wire, and each of the light-emitting devices comprises a first electrode and a second electrode disposed on the first electrode;
    wherein the auxiliary wire comprises a composite metal layer structure, side opening of the auxiliary wire form an undercut structure, the array substrate defines a groove exposing the undercut structure, and the second electrode extends into the groove and electrically connects with the auxiliary wire by contacting a portion of metal layers in the undercut structure; and
    the auxiliary wire comprises a first sub-metal layer, a second sub-metal layer, and a third sub-metal layer in a stack, and the second sub-metal layer is indented compared to the first sub-metal layer and the third sub-metal layer to form the undercut structure.

2. The display panel according to claim 1, wherein the second electrode contacts the first sub-metal layer of the auxiliary wire.

3. The display panel according to claim 1, wherein the first electrode and the second sub-metal layer are formed by etching with a first etching solution, and the first sub-metal layer and the third sub-metal layer are formed by etching with a second etching solution, and wherein the first etching solution is different from the second etching solution.

4. The display panel according to claim 1, wherein a material of the second electrode and the second sub-metal layer comprises at least one of aluminum, silver, or molybdenum.

5. The display panel according to claim 1, wherein each of the light-emitting devices comprises a light-emitting material layer disposed between the first electrode and the second electrode, and the light-emitting material layer avoids the undercut structure.

6. The display panel according to claim 1, wherein the array substrate comprises a thin film transistor, and the thin film transistor comprises a source drain electrode layer, a gate electrode layer, and a semiconductor layer, and wherein one of the source drain electrode layer or the gate electrode layer is positioned on a same layer with the auxiliary wire.

7. The display panel according to claim 1, wherein the undercut structure is positioned at an edge of the auxiliary wire.

8. The display panel according to claim 1, wherein the auxiliary wire comprises a connecting block, a width of the connecting block is greater than a width of any other parts of the auxiliary wire, the connecting block is provided with a through hole, the groove exposes the through hole, and the undercut structure is positioned in the through hole of the connecting block.

9. A method of manufacturing a display panel, comprising the following manufacturing steps:
    step S100: providing a substrate, and forming a thin film transistor and an auxiliary wire of an array substrate on the substrate, wherein one of a source drain electrode layer or a gate electrode layer of the thin film transistor is forming at the same time with the auxiliary wire, and wherein the auxiliary wire comprises a composite metal layer structure;
    step S200: forming an insulating layer and forming a groove in the insulating layer at the same time, wherein the groove exposes an edge of the auxiliary wire;
    step S300: forming a first metal layer on the insulating layer;
    step S400: patterning the first metal layer to simultaneously form a first electrode of a light-emitting device and an undercut structure on the auxiliary wire in the groove;
    step S500: forming a light-emitting material layer on the first electrode, wherein the light-emitting material layer avoids the undercut structure; and
    step S600: forming a second electrode of the light-emitting device on the light-emitting material layer, wherein the second electrode is electrically connected to the auxiliary wire by contacting a portion of the composite metal layer structure in the undercut structure;
    wherein in the step S400, the auxiliary wire comprises a first sub-metal layer, a second sub-metal layer, and a third sub-metal layer which in a stack, and the second sub-metal layer is indented compared to the first sub-metal layer and the third sub-metal layer to form the undercut structure.

10. The method of manufacturing the display panel according to claim 9, wherein in the step S400, the first electrode and the second sub-metal layer are forming by etching with a same etching solution, and when etching to form the first electrode and the second sub-metal layer, the first sub-metal layer and the third sub-metal layer are not etched.

11. The method of manufacturing the display panel according to claim 9, wherein in the step S500, the method of forming the light-emitting material layer comprises:
    vapor-depositing the light-emitting material layer on the first electrode, wherein a vapor deposition direction of material of the light-emitting material layer is consistent with an opening direction of the undercut structure; or
    Inkjet printing the light-emitting material layer on the first electrode, wherein the light-emitting material layer does not cover the groove.

12. The method of manufacturing the display panel according to claim 11, wherein in the step S600, the method of forming the second electrode comprises forming the second electrode on the light-emitting material layer, wherein a sputtering direction of material of the second electrode points to the opening direction of the undercut structure.

13. A display terminal, comprising a terminal main body and a display panel, wherein the terminal main body and the display panel are combined into one body, wherein the display panel comprises an array substrate, and light-emitting devices disposed in an array on the array substrate, wherein the array substrate comprises an auxiliary wire, and wherein each of the light-emitting devices comprises a first electrode and a second electrode disposed on the first electrode;

wherein the auxiliary wire comprises a composite metal layer structure, side opening of the auxiliary wire form an undercut structure, the array substrate defines a groove exposing the undercut structure, and the second electrode extends into the groove and electrically connects with the auxiliary wire by contacting a portion of metal layers in the undercut structure; and the auxiliary wire comprises a first sub-metal layer, a second sub-metal layer, and a third sub-metal layer in a stack, and the second sub-metal layer is indented compared to the first sub-metal layer and the third sub-metal layer to form the undercut structure.

14. The display terminal according to claim 13, wherein the second electrode contacts the first sub-metal layer of the auxiliary wire.

15. The display terminal according to claim 13, wherein the first electrode and the second sub-metal layer are formed by etching with a first etching solution, and the first sub-metal layer and the third sub-metal layer are formed by etching with a second etching solution, and wherein the first etching solution is different from the second etching solution.

16. The display terminal according to claim 13, wherein each of the light-emitting devices comprises a light-emitting material layer disposed between the first electrode and the second electrode, and the light-emitting material layer avoids the undercut structure.

17. The display terminal according to claim 13, wherein the array substrate comprises a thin film transistor, and the thin film transistor comprises a source drain electrode layer, a gate electrode layer, and a semiconductor layer, and wherein one of the source drain electrode layer or the gate electrode layer is positioned on a same layer with the auxiliary wire.

* * * * *